US012757778B2

(12) United States Patent
Shirao

(10) Patent No.: US 12,757,778 B2
(45) Date of Patent: Oct. 6, 2026

(54) SEMICONDUCTOR DEVICE AND METHOD OF MANUFACTURING THE SAME

(71) Applicant: Mitsubishi Electric Corporation, Tokyo (JP)

(72) Inventor: Akitoshi Shirao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 391 days.

(21) Appl. No.: 18/469,493

(22) Filed: Sep. 18, 2023

(65) Prior Publication Data

US 2024/0194551 A1 Jun. 13, 2024

(30) Foreign Application Priority Data

Dec. 8, 2022 (JP) ................................ 2022-196224

(51) Int. Cl.
*H10W 74/10* (2026.01)
*H10W 70/40* (2026.01)
*H10W 90/00* (2026.01)

(52) U.S. Cl.
CPC ........ *H10W 74/111* (2026.01); *H10W 70/481* (2026.01); *H10W 90/00* (2026.01); *H10W 74/10* (2026.01); *H10W 90/751* (2026.01)

(58) Field of Classification Search
CPC ... H01L 23/28; H10W 74/111; H10W 74/016; B29C 45/14; B29C 45/02
See application file for complete search history.

(56) References Cited

U.S. PATENT DOCUMENTS

2002/0017738 A1* 2/2002 Miyajima ......... B29C 45/14655
264/272.17

FOREIGN PATENT DOCUMENTS

JP H04-068529 U 6/1992
JP H05-036745 A 2/1993
JP H06-55513 A 3/1994
JP H10-058478 A 3/1998
JP 2015-216228 A 12/2015
WO 2020/021667 A1 1/2020

OTHER PUBLICATIONS

An Office Action, “Notice of Reasons for Refusal,” mailed by the Japanese Patent Office on Nov. 11, 2025, which corresponds to Japanese Patent Application No. 2022-196224 and is related to U.S. Appl. No. 18/469,493; with English language translation.

* cited by examiner

*Primary Examiner* — Douglas M Menz
(74) *Attorney, Agent, or Firm* — Studebaker Brackett PLLC

(57) ABSTRACT

Provided is a method of manufacturing a semiconductor device capable of increasing reliability. A method of manufacturing a semiconductor device includes steps of: filling a cavity and at least a part of a sealing material storage part with a sealing material by injecting the sealing material from a first gate of a mold, the mold including the cavity in which an electrical circuit is disposed, the first gate and a second gate provided to the cavity, and the sealing material storage part provided to an outer side of the cavity to be connected to the second gate; and making the sealing material filling the sealing material storage part flow back to the cavity via the second gate.

4 Claims, 15 Drawing Sheets

SEMICONDUCTOR DEVICE AND METHOD OF MANUFACTURING THE SAME

BACKGROUND OF THE INVENTION

Field of the Invention

The present disclosure relates to a semiconductor device and a method of manufacturing the semiconductor device.

Description of the Background Art

A semiconductor device manufactured by transfer molding has a structure that a semiconductor chip is sealed with resin. Japanese Patent Application Laid-Open No. 5-36745 discloses a sealing mold reducing an unfilled part of resin. The sealing mold includes a resin reservoir connected to a resin outflow gate. In filling the resin, air bubbles remaining in a gap part in a cavity are exhausted to the resin reservoir together with the resin. As a result, the unfilled part decreases.

SUMMARY

In a process of manufacturing the semiconductor device by the transfer molding, deformation occurs in an elongated shape of a metal wire connecting a semiconductor chip or a lead frame, for example, due to flow of the resin filling the mold. The metal wire constitutes an electrical circuit including a semiconductor chip, thus there is a possibility that the deformation of the elongated shape of the metal wire reduces reliability of the semiconductor device.

The present disclosure provides a method of manufacturing a semiconductor device capable of increasing reliability.

A method of manufacturing a semiconductor device according to the present disclosure is a method of manufacturing a semiconductor device in which an electrical circuit including a semiconductor chip and a plurality of metal wires electrically connected to the semiconductor chip is sealed with a sealing material. The method of manufacturing the semiconductor device includes processes of: filling a cavity and at least a part of a sealing material storage part with the sealing material by injecting the sealing material from a first gate of a mold, the mold including the cavity in which the electrical circuit is disposed, the first gate and a second gate provided to the cavity, and the sealing material storage part provided to an outer side of the cavity to be connected to the second gate; and making the sealing material filling the sealing material storage part flow back to the cavity via the second gate.

Provided is a method of manufacturing a semiconductor device capable of increasing reliability.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
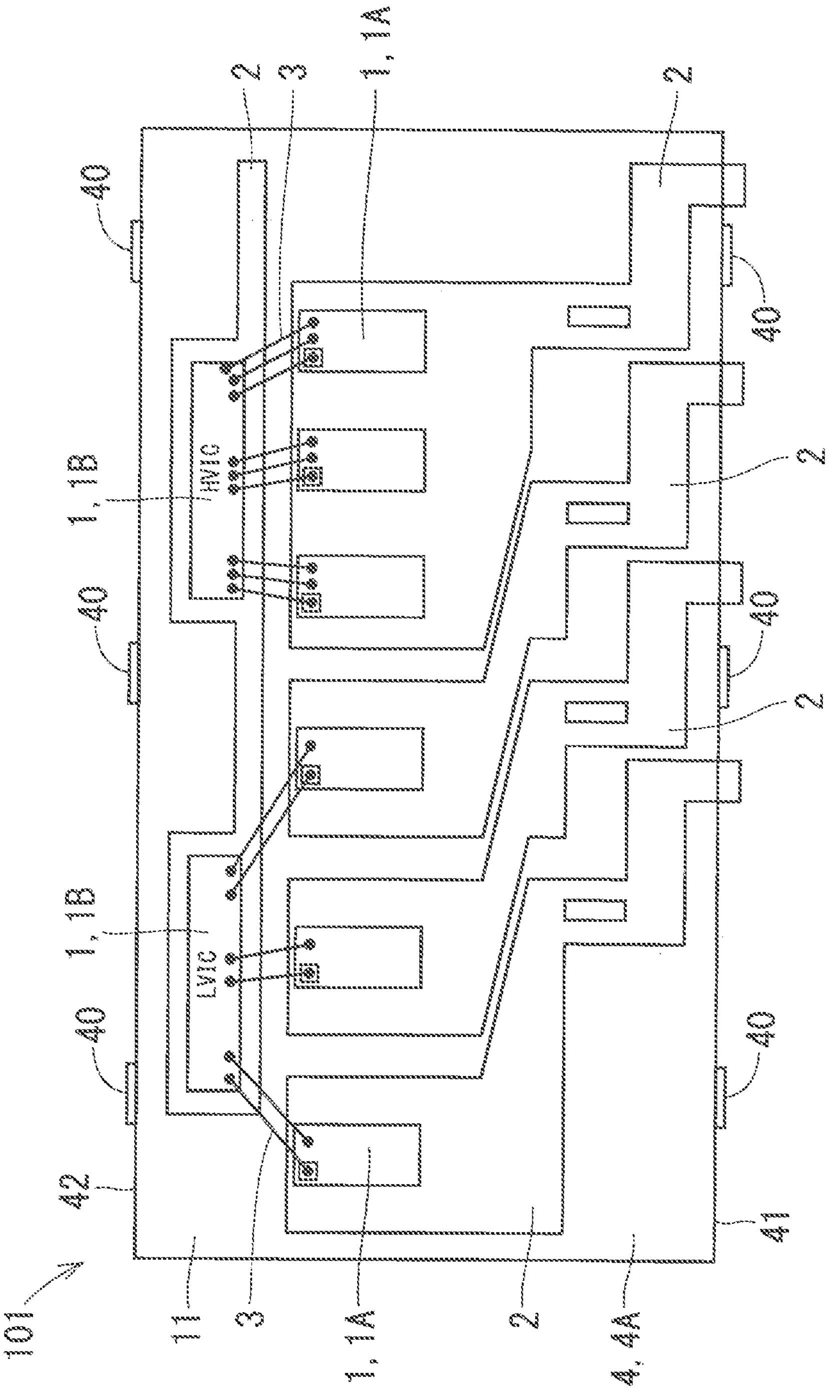
FIG. 1 is a plan view illustrating a configuration of a semiconductor device according to an embodiment 1.

FIG. 1 is a plan view illustrating a configuration of a semiconductor device 101 according to an embodiment 1. The semiconductor device 101 includes a semiconductor chip 1, a lead frame 2, a plurality of metal wires 3, and a sealing material 4. FIG. 1 illustrates a perspective view of an inner part of the semiconductor device 101.

The semiconductor chip 1 is bonded to an upper surface of the lead frame 2 via a bonding material (not shown) such as a solder. The semiconductor chip 1 is formed of a semiconductor such as Si or a so-called wide bandgap semiconductor such as SiC, GaN, or gallium oxide.

The semiconductor chip 1 according to the embodiment 1 includes an insulated gate bipolar transistor (IGBT) chip 1A and an integrated circuit (IC) chip 1B relating to control of the IGBT chip 1A. The IC chip 1B outputs a gate signal to the IGBT chip 1A, and the IGBT chip 1A performs a switching operation based on the gate signal. A metal oxide semiconductor field effect transistor (MOSFET) chip may be provided in place of the IGBT chip 1A.

The semiconductor device 101 according to the embodiment 1 is a three-phase inverter, and includes one low-side ICchip 1B (LVIC), one high-side IC chip 1B (HVIC), and six IGBT chips 1A.

The lead frame 2 is a frame-like component made up of a flat plate having conductivity and processed to be bended, for example. A part of the lead frame 2 is exposed from the sealing material 4, and functions as a terminal part.

Each of the plurality of metal wires 3 is electrically connected to the semiconductor chip 1. In the embodiment 1, three IGBT chips 1A are connected to one low-side IC chip 1B by the metal wire 3. In the similar manner, three IGBT chips 1A are connected to one high-side IC chip 1B by the metal wire 3.

The lead frame 2 and the metal wire 3 function as inner wirings of the semiconductor device 101.

Figure 2:
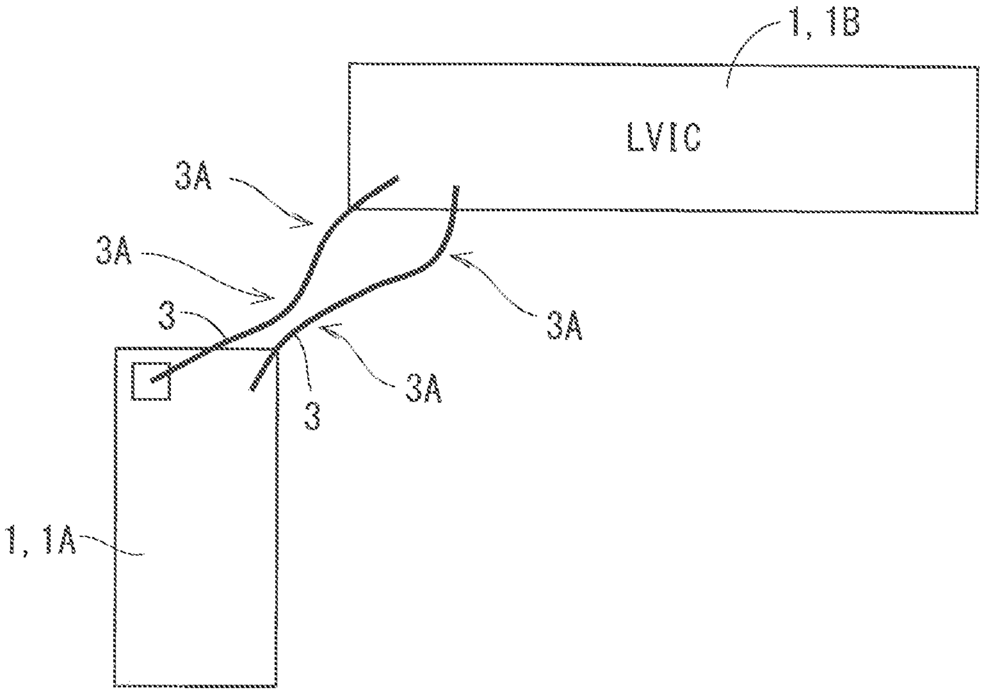
FIG. 2 is a plan view illustrating a configuration of a metal wire according to the embodiment 1.

FIG. 2 is a plan view illustrating a configuration of the metal wire 3 according to the embodiment 1. The metal wire 3 includes two curved parts 3A in an elongated shape in a plan view. The curved part 3A is formed in a flow-back process described hereinafter, thus the number of the curved parts 3A may be different for each metal wire 3. In other words, at least one metal wire 3 in the plurality of metal wires 3 includes two or more curved parts 3A in the elongated shape in a plan view.

As illustrated in FIG. 1, the sealing material 4 seals an electrical circuit made up of the semiconductor chip 1, the lead frame 2, and the plurality of metal wires 3. The sealing material 4 according to the embodiment 1 is epoxy resin. The epoxy resin includes a filler improving thermal conductivity. Viscosity of the epoxy resin is equal to or larger than 5 Pa·s, for example.

A distance from the lead frame 2 provided with the IGBT chip 1A to an outer surface of the sealing material 4, that is to say, a thickness of the sealing material 4 is smaller than that of the sealing material 4 in the lead frame 2 provided with the IC chip 1B. The thickness of the sealing material 4 in the lead frame 2 provided with the IGBT chip 1A is equal to or smaller than 0.5 mm.

The sealing material 4 has a rectangular shape in a plan view. The rectangular shape has a first side 41 and a second side 42 facing the first side 41. The sealing material 4 includes a plurality of sealing material cutting marks 40 provided to the first side 41 and the second side 42. The sealing material 4 according to the embodiment 1 includes three sealing material cutting marks 40 in each of the first side 41 and the second side 42 of the rectangular shape. However, the number of the sealing material cutting marks 40 is not limited thereto.

Figure 3:
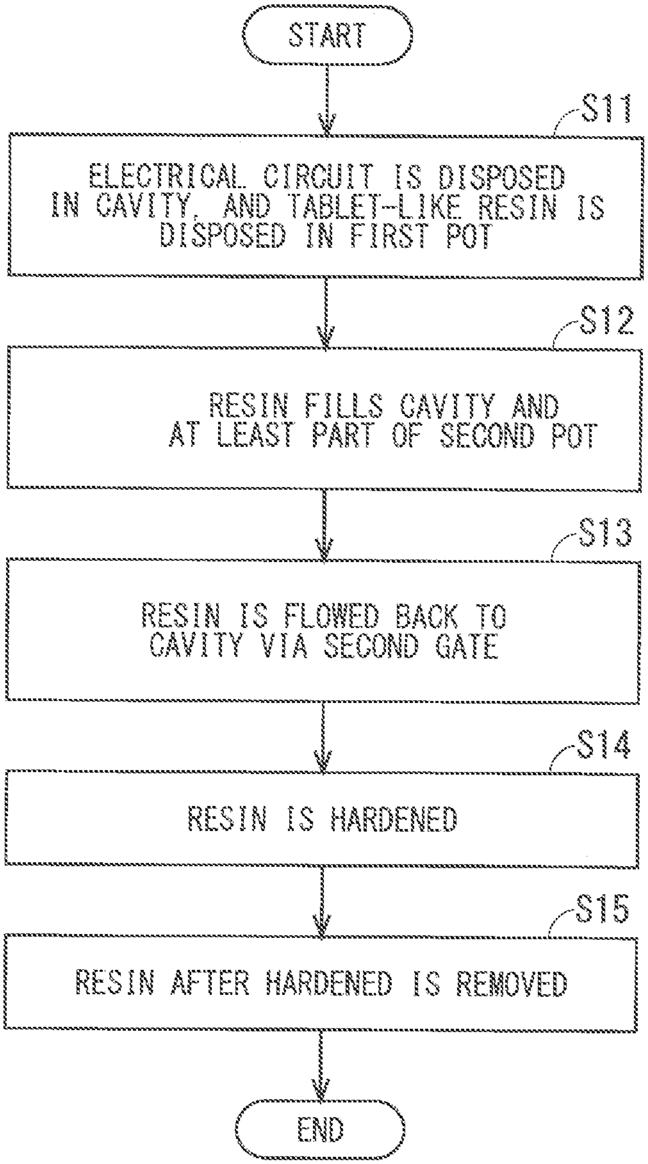
FIG. 3 is a flow chart illustrating a method of manufacturing the semiconductor device according to the embodiment 1.

FIG. 3 is a flow chart illustrating a method of manufacturing the semiconductor device 101 according to the embodiment 1. FIG. 4 to FIG. 7 are diagrams each illustrating a process of manufacturing the semiconductor device 101 according to the embodiment 1. Each of FIG. 4 to FIG. 7 illustrates a cross section of a mold 10 used for transfer molding. The semiconductor device 101 is manufactured by a molding device. A case where the sealing material 4 is resin 4A is described hereinafter.

Figure 4:
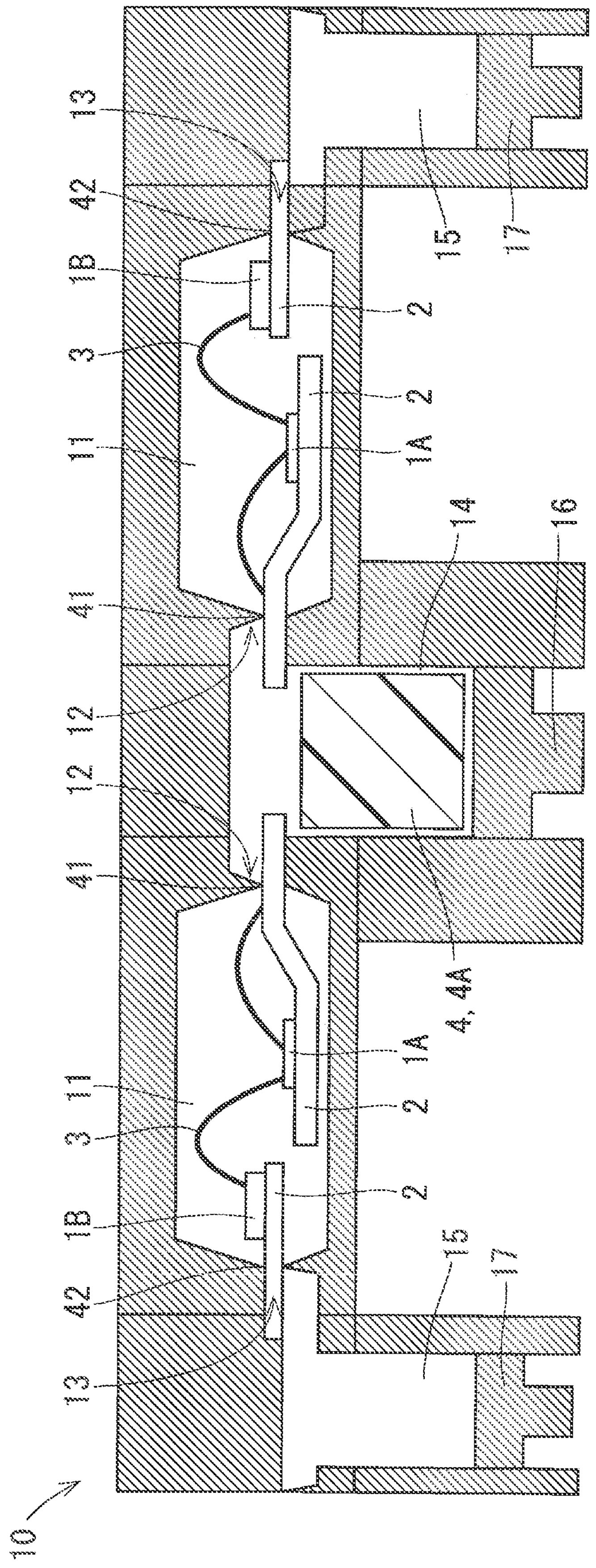
FIG. 4 is a diagram illustrating a process of manufacturing the semiconductor device according to the embodiment 1.

The mold 10 includes a cavity 11, a first gate 12, a second gate 13, a first pot 14, and a second pot 15 as illustrated in FIG. 4.

The cavity 11 corresponds to an outer shape of a resin package, that is to say, an outer shape of the sealing material 4 in the completed semiconductor device 101. Thus, the cavity 11 has a rectangular shape in a plan view in the manner similar to the completed sealing material 4, and the rectangular shape has the first side 41 and the second side 42.

The first gate 12 is provided to a side surface of the cavity 11, and functions as a flow inlet of the resin 4A. The first gate 12 according to the embodiment 1 is provided to the first side 41 of the cavity 11.

The second gate 13 is provided to the side surface of the cavity 11, and functions as a flow outlet and a flow inlet of the resin 4A. The second gate 13 according to the embodiment 1 is provided to the second side 42 of the cavity 11.

The first pot 14 is provided to an outer side of the cavity 11, and is connected to the first gate 12. The first pot 14 is connected to the cavity 11 via the first gate 12.

The second pot 15 is a sealing material storage part. The second pot 15 is provided to the outer side of the cavity 11, and is connected to the second gate 13. The second pot 15 is connected to the cavity 11 via the second gate 13. The sealing material storage part may include not only the second pot 15 but also a flow path between the second pot 15 and the second gate 13.

In Step S11, an electrical circuit is disposed in the cavity 11 of the mold 10 as illustrated in FIG. 4. The electrical circuit has a configuration that the IGBT chip 1A, the IC chip 1B, the lead frame 2, and the metal wire 3 are electrically connected to each other. In this Step S11, the resin 4A having a tablet-like shape is disposed in the first pot 14 of the mold 10 as the sealing material 4. An appropriate amount of the resin 4A having the tablet-like shape is set based on a degree of a gap between a lower surface of the lead frame 2 and the mold 10 and a degree of occurrence of an unfilled part. The appropriate amount is substantially 1.2 to 2.0 times a volume of the cavity 11. Resin having an appropriate gelation time is selected in Step S11 to prevent increase in the viscosity of the resin 4A due to progression of hardening thereof in Step S13 described hereinafter.

Figure 5:
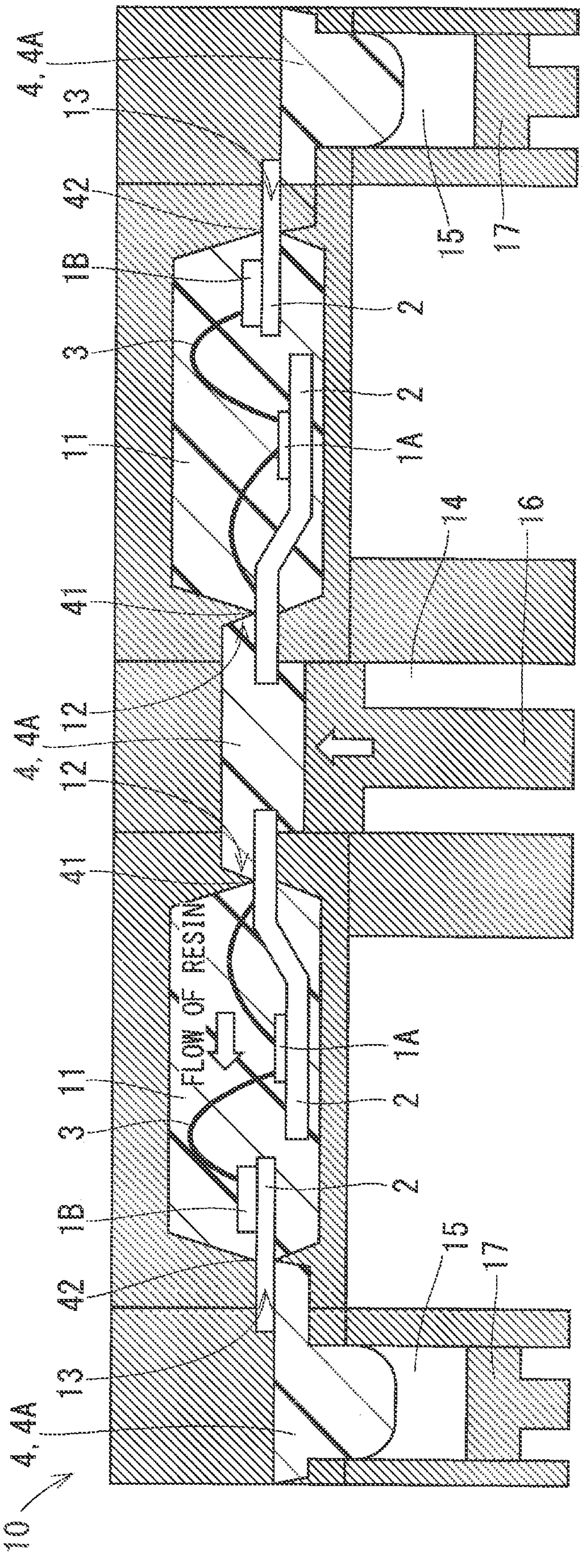
FIG. 5 is a diagram illustrating a process of manufacturing the semiconductor device according to the embodiment 1.

In Step S12, the resin 4A in liquid form is injected from the first gate 12 of the mold 10 to fill the cavity 11 and the second pot 15 with the resin 4A as illustrated in FIG. 5. Herein, the resin 4A fills the whole cavity 11 and at least a part of the second pot 15. In this process, the molding device applies pressure to a first plunger 16 connected to the first pot 14. Accordingly, the resin 4A in liquid form is injected into the cavity 11 from the first pot 14 via the first gate 12, and is further injected into the second pot 15 from the cavity 11 via the second gate 13. The resin 4A in liquid form is injected from the first pot 14 until filling at least a part of the second pot 15. In other words, the resin 4A is excessively injected with respect to a volume of the cavity 11.

According to this filling process in Step S12, the resin 4A in liquid form also fills the gap between the lower surface of the lead frame 2 and the mold 10, thus occurrence of an unfilled part such as voids is reduced. A deairing process of deairing air in the cavity 11 may be executed before the filling process, and in this case, occurrence of the unfilled part is further reduced.

Figure 8:
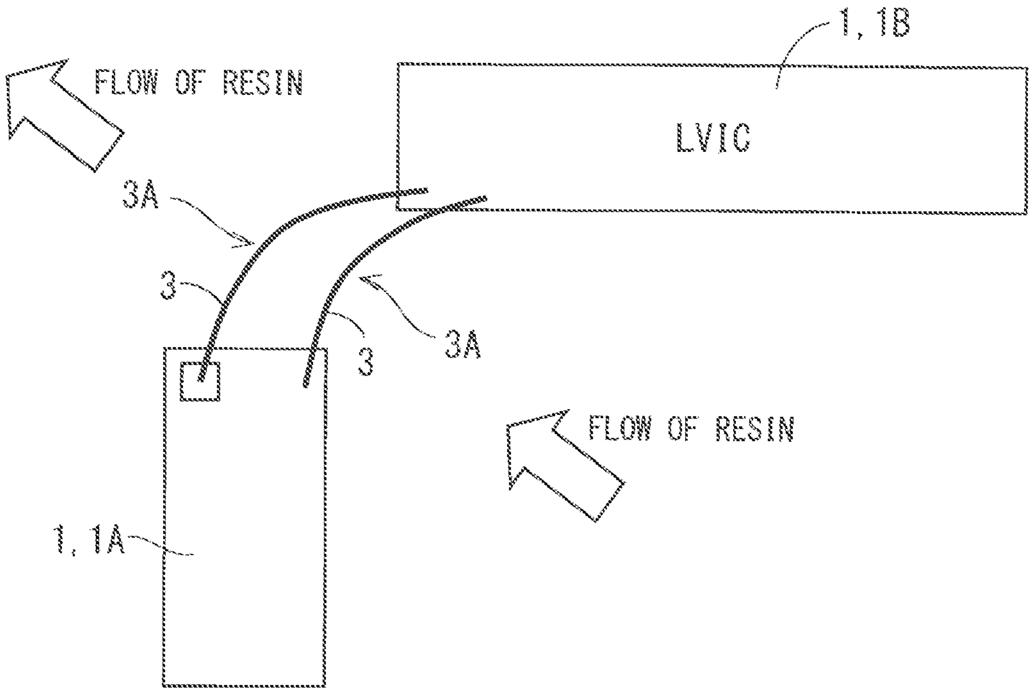
FIG. 8 is a plan view illustrating deformation of the metal wire in a filling process.

In this filling process in Step S12, the metal wire 3 is deformed by flow of the resin 4A injected into the cavity 11 from the first gate 12. FIG. 8 is a plan view illustrating deformation of the metal wire 3 in the filling process. In FIG. 8, the resin 4A flows in a direction from a right lower side to a left upper side. One curved part 3A is formed in the elongated shape of the metal wire 3 in a plan view by the flow of the resin 4A.

Figure 6:
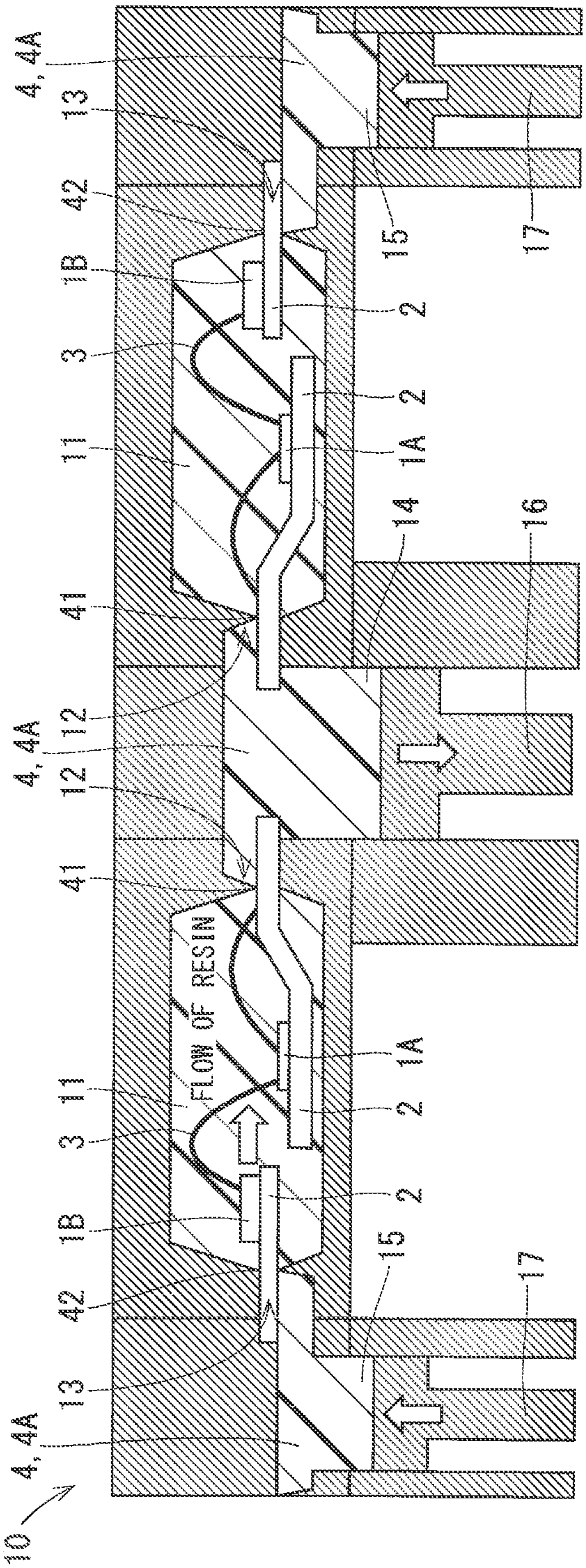
FIG. 6 is a diagram illustrating a process of manufacturing the semiconductor device according to the embodiment 1.
Figure 9:
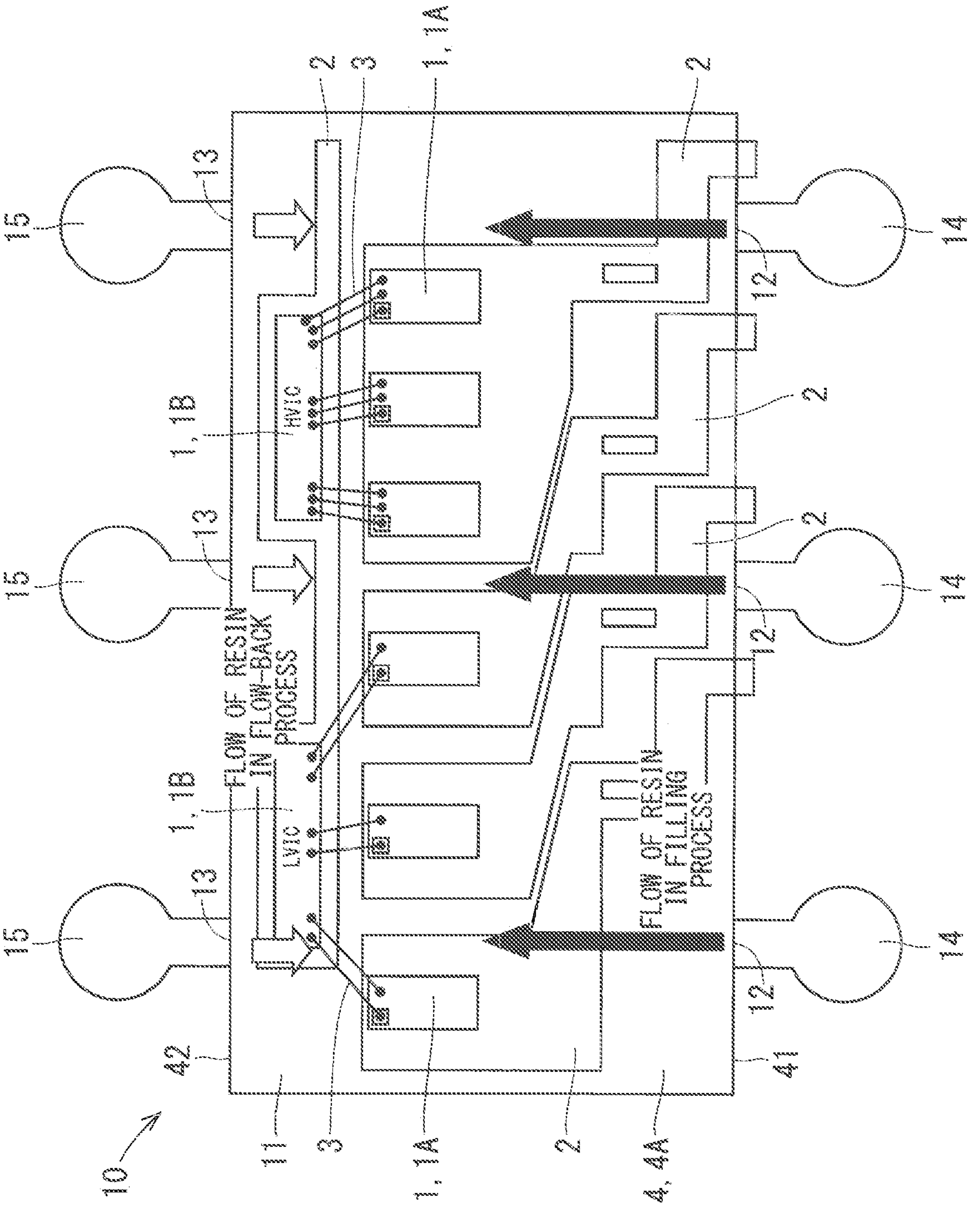
FIG. 9 is a diagram illustrating an inner configuration of a mold and flow of resin in the filling process and a flow-back process.

In Step S13, the resin 4A which has filled the second pot 15 is flowed back to the cavity 11 via the second gate 13 as illustrated in FIG. 6. At this time, the molding device applies pressure to a second plunger 17 connected to the second pot 15, and also depressurizes the first plunger 16. Specifically, the molding device applies higher pressure to the second plunger 17 than that applied to the first plunger 16. Accordingly, the resin 4A in the second pot 15 flows in a direction different from the direction in which the resin 4A flows in the filling process in Step S12. In other words, the resin 4A flows back. FIG. 9 is a diagram illustrating an inner configuration of the mold 10 and the flow of resin 4A in the filling process and the flow-back process.

Figure 10:
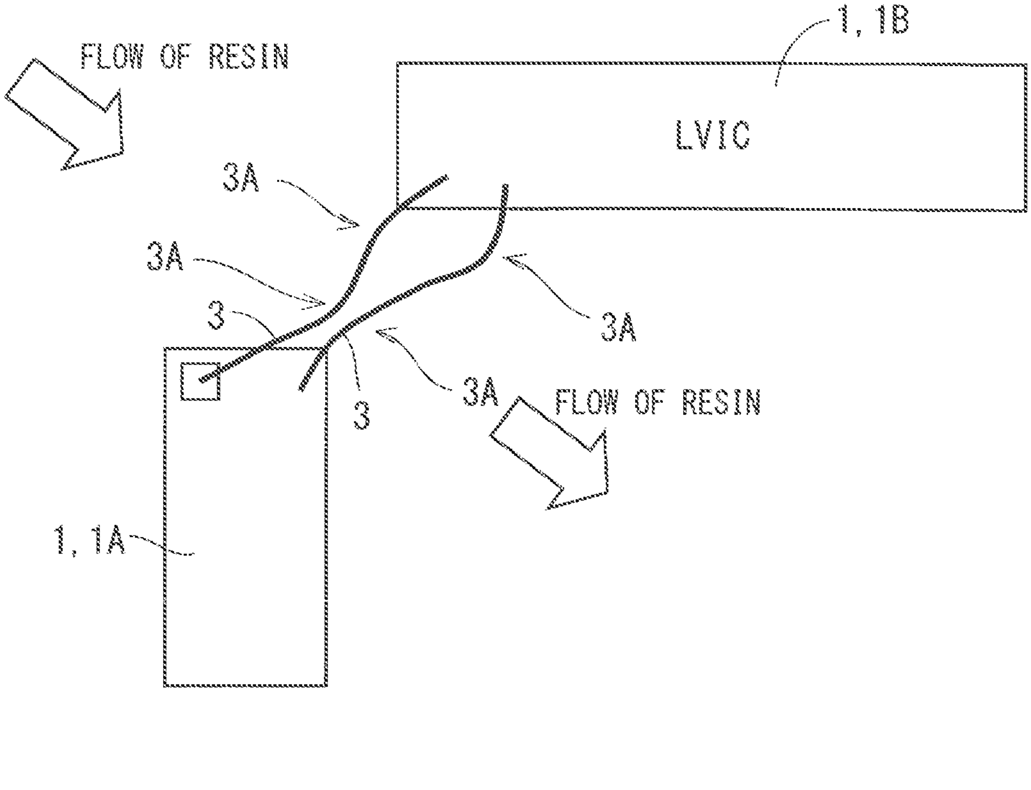
FIG. 10 is a plan view illustrating deformation of the metal wire in the flow-back process.

In this flow-back process in Step S13, the metal wire 3 is deformed again by the flow of the resin 4A moving into the cavity 11 from the second gate 13. FIG. 10 is a plan view illustrating the deformation of the metal wire 3 in the flow-back process. In FIG. 10, the resin 4A flows in a direction from a left upper side to a right lower side. Two or more curved parts 3A are formed in the elongated shape of the metal wire 3 in a plan view by the flow of the resin 4A. The direction in which the resin 4A flows differs depending on a position of the metal wire 3 in the cavity 11. Thus, the number of the curved parts 3A of the metal wire 3 may differ depending on the position of the metal wire 3. Two or more curved parts 3A are formed in the elongated shape in a plan view of at least one metal wire 3 in the plurality of metal wires 3 by this flow-back process.

In Step S13, a degree of curve of the metal wire 3 formed in Step S12 is corrected. The molding device may perform a minor adjustment of a movement amount of the second plunger 17 based on an analysis result of a degree of correction of the metal wire 3.

Figure 7:
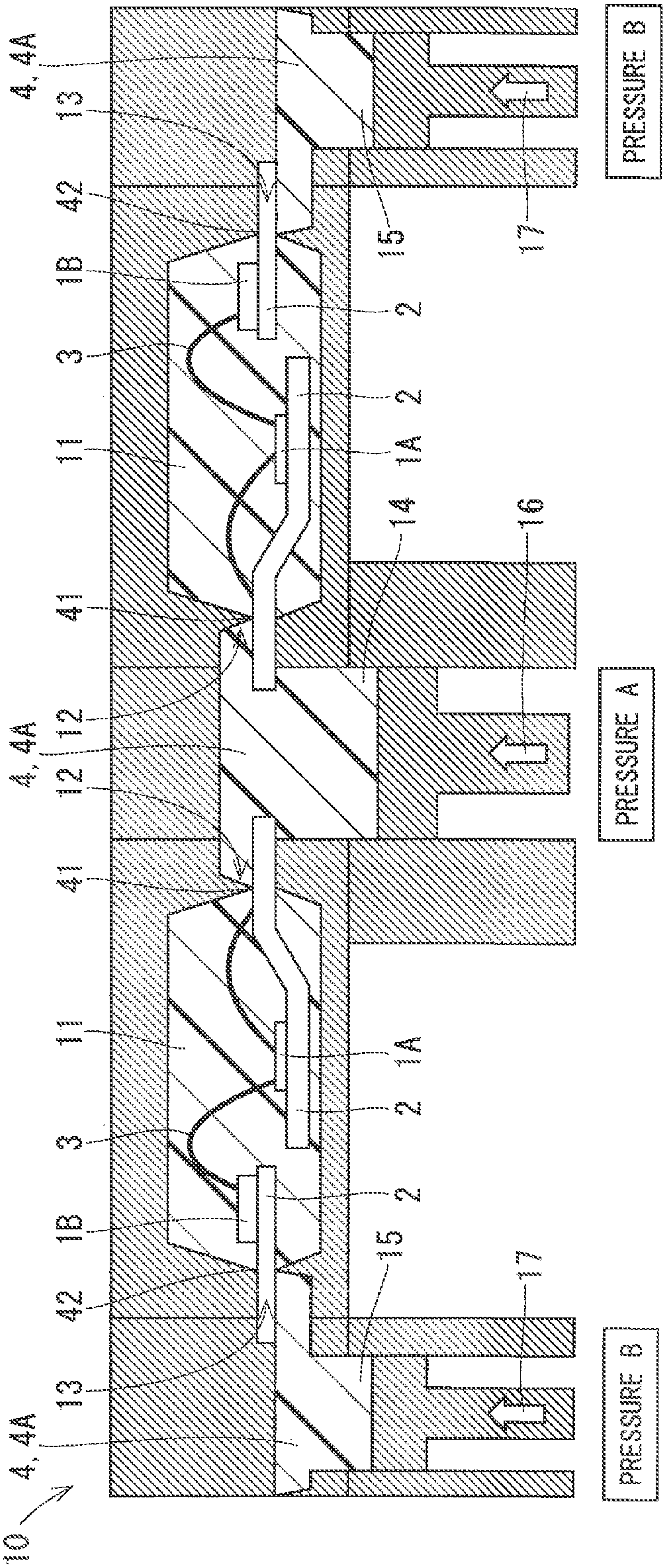
FIG. 7 is a diagram illustrating a process of manufacturing the semiconductor device according to the embodiment 1.

In Step S14, the resin 4A is hardened as illustrated in FIG. 7. The molding device controls balance between pressure A applied to the first plunger 16 and pressure B applied to the second plunger 17 to prevent the resin 4A from flowing during hardening.

In Step S15, the resin 4A which has been hardened and extends from the first gate 12 or the second gate 13 toward an outer side of the cavity 11 is removed. The resin 4A which has been hardened and extends toward the outer side of the cavity 11 corresponds to a so-called cull and runner. The cull is the resin 4A hardened in the first pot 14 and the second pot 15, for example. The runner is the resin 4A hardened in a flow path between the first pot 14 and the first gate 12 and a flow path between the second pot 15 and the second gate 13, for example. The cull and the runner is folded and broken on a principle of leverage based on positions of the first gate 12 and the second gate 13 as supporting points. The plurality of sealing material cutting marks 40 are formed in the first side 41 and the second side 42 of the resin package to correspond to the positions where the cull and the runner has been folded and broken.

To summarize the above description, the method of manufacturing the semiconductor device according to the embodiment 1 is the method of manufacturing the semiconductor device 101 in which the electrical circuit including the semiconductor chip 1 and the plurality of metal wires 3 electrically connected to the semiconductor chip 1 is sealed with the sealing material 4. The method of manufacturing the semiconductor device 101 includes the process of filling the cavity 11 and at least a part of the sealing material storage part (the second pot 15) with the sealing material 4 by injecting the sealing material 4 from the first gate 12 of the mold 10, the mold 10 including the cavity 11 in which the electrical circuit is disposed, the first gate 12 and the second gate 13 provided to the cavity 11, and the sealing material storage part provided to the outer side of the cavity 11 to be connected to the second gate 13. The manufacturing method includes the process of making the sealing material 4 filling the sealing material storage part flow back to the cavity 11 via the second gate 13.

In the semiconductor device 101 manufactured by such a manufacturing method, the degree of deformation of the elongated shape of the metal wire 3 is reduced. Thus, reliability of the semiconductor device 101 is increased.

When the flow-back process described in the embodiment 1 is not executed, for example, formed is a structure that the plurality of metal wires 3 are located close to each other or a structure that the metal wire 3 and an edge of the semiconductor chip 1 are located close to each other. The metal wire 3 constitutes an electrical circuit including the semiconductor chip 1, thus there is a possibility that such deformation of the metal wire 3 reduces reliability of the semiconductor device 101.

In the meanwhile, when the flow-back process is executed, the elongated shape of the metal wire 3 deformed in the filling process is corrected. Such metal wires 3 have the configuration that a spatial distance therebetween is ensured, thus do not electrically interfere with each other. Thus, reliability of the semiconductor device 101 such as a lifetime thereof is increased.

In the filling process, the resin 4A is continuously injected into the cavity 11 from the first gate 12 until the resin 4A fills the second pot 15. Accordingly, the resin 4A also fills the gap between the lead frame 2 and the mold 10. As a result, the gap disappears. Even when the resin 4A having a high percentage of filler content and having viscosity equal to or larger than 5 Pa·s is adopted as the sealing material 4, the unfilled part does not occur according to the filling process in the embodiment 1.

Such a high-quality resin package is excellent in heat radiation properties, and is appropriate for a power control semiconductor device. For example, it is also possible to design an interval between the lead frame 2 provided with the IGBT chip 1A and the mold to be equal to or smaller than 0.5 mm. That is to say, according to the manufacturing method in the embodiment 1, achievable is a package in which the thickness of the resin 4A corresponding to the position where the IGBT chip 1A is mounted is equal to or smaller than 0.5 mm. Both downsizing and improvement of heat radiation properties are achieved in the semiconductor device 101 having such a package.

As described above, the method of manufacturing the semiconductor device 101 according to the embodiment 1 prevents the occurrence of the unfilled part of the resin 4A and further corrects the elongated shape of the metal wire 3.

Embodiment 2

Figure 11:
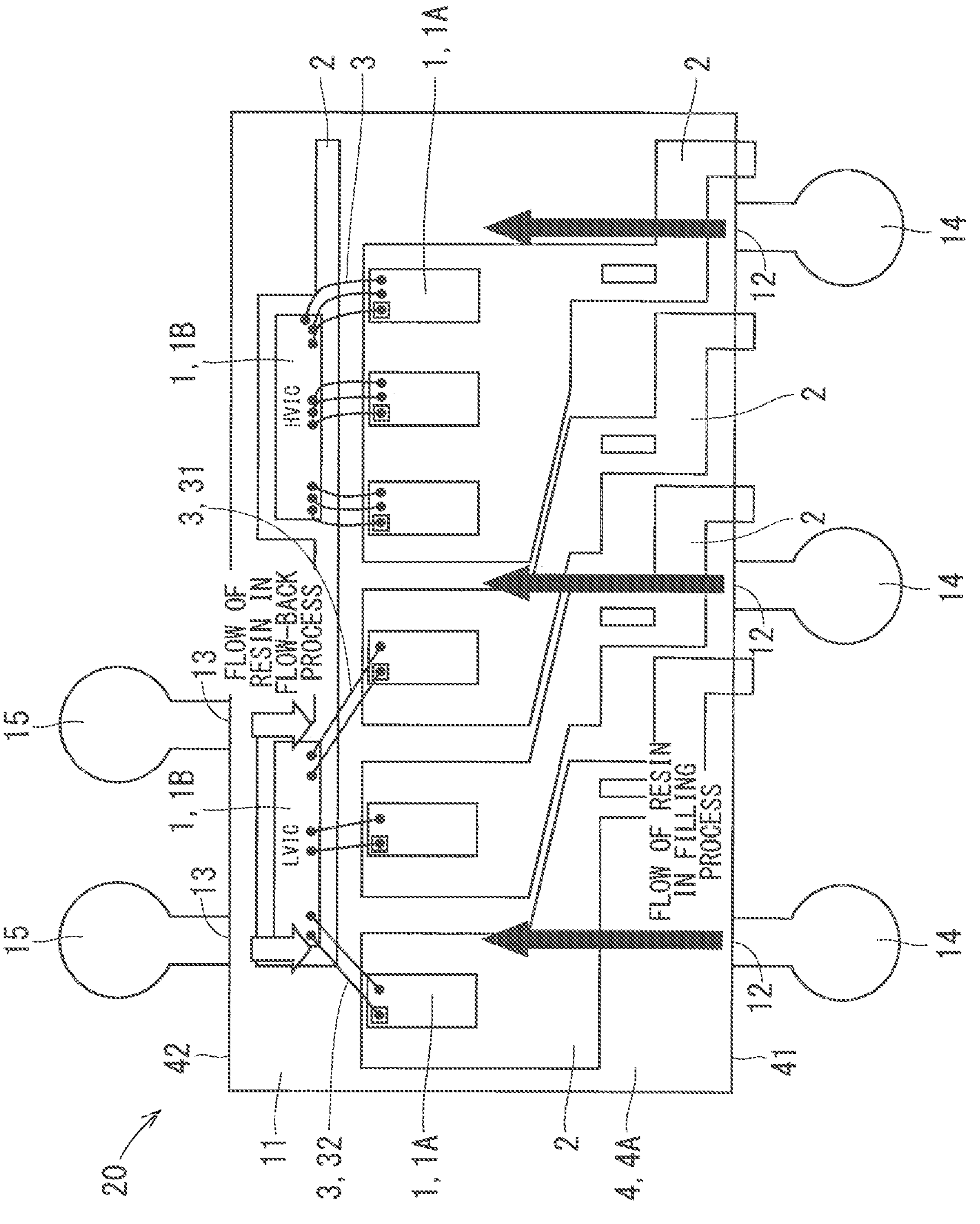
FIG. 11 is a diagram illustrating an inner configuration of a mold and flow of resin in an embodiment 2.

FIG. 11 is a diagram illustrating an inner configuration of a mold 20 and flow of the resin 4A in an embodiment 2. A position of the second gate 13 according to the embodiment 2 is different from that of the second gate 13 according to the embodiment 1.

The second gate 13 is disposed near a metal wire 31 extending in a direction having a largest angle in a plurality of angles between a direction in which the resin 4A is injected into the cavity 11 from the first gate 12 and a direction in which each of the plurality of metal wires 3 extends in a plan view.

The direction in which the resin 4A is injected in the embodiment 2 is a direction from the first side 41 toward the second side 42 of the cavity 11, and in other words, a direction perpendicular to the first side 41.

For example, in FIG. 11, an angle between the direction in which nine metal wires 3 disposed in a right half extend and a direction perpendicular to the first side 41 is smaller than an angle based on the metal wires 3 disposed in a left half. An angle between a direction in which the fifth and sixth metal wires 31 from a left side in FIG. 11 extend and a direction perpendicular to the first side 41 is larger than an angle between a direction of the other metal wires 3 and a direction perpendicular to the first side 41. Accordingly, the second gate 13 is disposed near the fifth and sixth metal wires 31 from the left side in FIG. 11.

The number of the second gates 13 may increase or decrease in accordance with the angle between the direction in which the metal wire 3 extends and the direction perpendicular to the first side 41. That is to say, the number of the second gates 13 may be one or three or more. For example, according to the embodiment 2, the second gate 13 is also disposed near first and second metal wires 32 from the left side in FIG. 11.

In the filling process, when the angle between the direction in which the metal wire 3 extends and the direction in which the resin 4A in liquid form flows is large, the metal wire 3 is easily deformed, and a deformation amount is also large. The second gate 13 according to the embodiment 2 is provided near the metal wires 31 and 32 greatly deformed.

In the flow-back process, the resin 4A flowing back to the cavity 11 from the second gate 13 is moved in a direction from the second side 42 toward the first side 41 of the cavity 11. Thus, elongated shapes of the metal wires 31 and 32 greatly deformed in the filling process are selectively corrected in the flow-back process.

According to the method of manufacturing the semiconductor device in the embodiment 2, the metal wire 3 having large deformation due to the flow of the resin 4A in the filling process can be selectively corrected.

Embodiment 3

Figure 12:
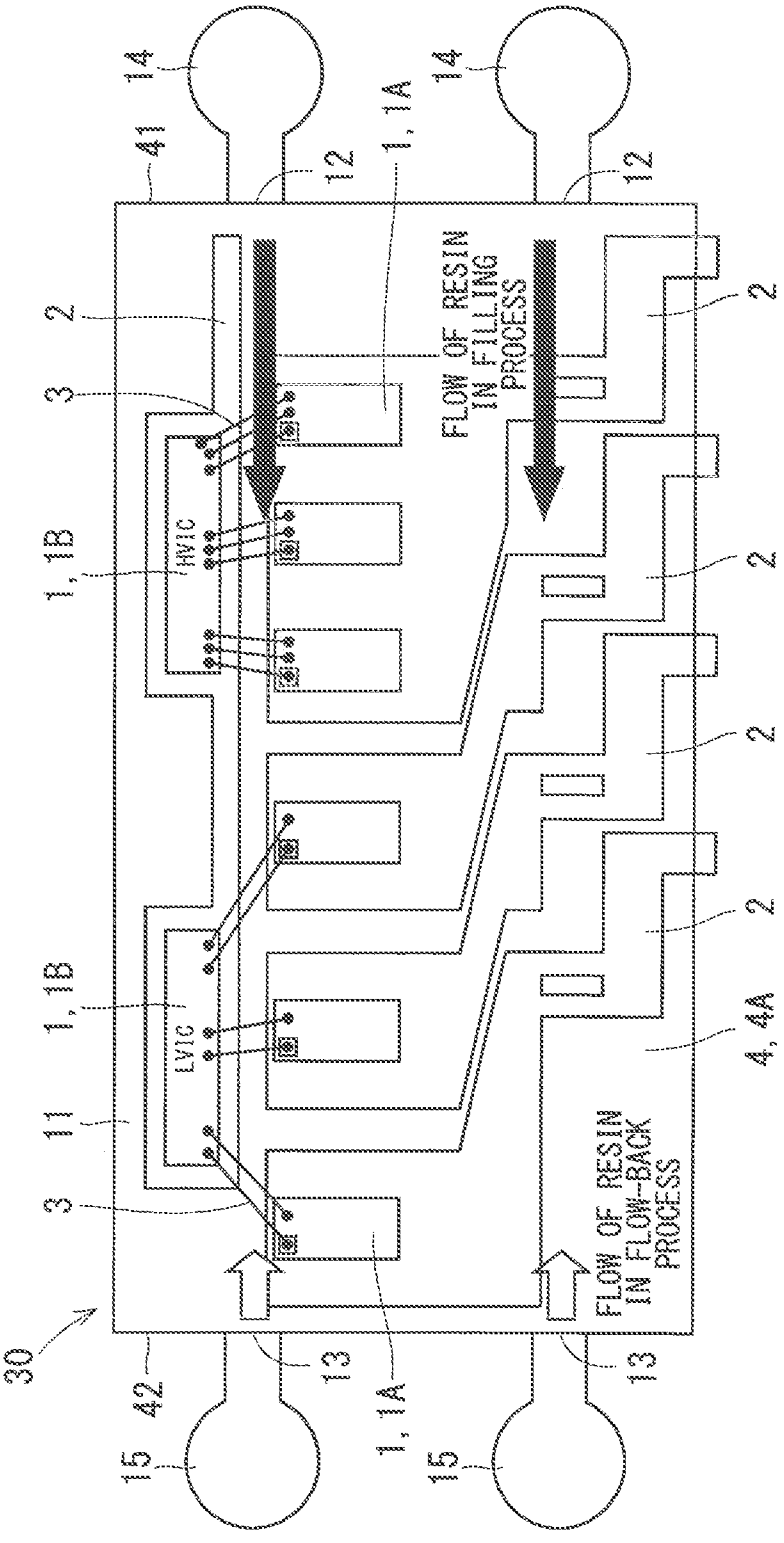
FIG. 12 is a diagram illustrating an inner configuration of a mold and flow of resin in an embodiment 3.

FIG. 12 is a diagram illustrating an inner configuration of the mold 30 and flow of the resin 4A in an embodiment 3. Positions of the first gate 12 and the second gate 13 according to the embodiment 3 is different from those according to the embodiment 1.

The first side 41 and the second side 42 of the cavity 11 correspond to sides having a small angle with the direction in which the metal wire 3 to be corrected extends in the four sides constituting the rectangular shape of the cavity 11. The first gate 12 is provided to the first side 41, and the second gate 13 is provided to the second side 42.

In the filling process according to the embodiment 3, the resin 4A in liquid form is injected from a direction substantially perpendicular to the direction in which the metal wire 3 extends. Also in the flow-back process, the resin 4A flows back from a direction perpendicular to the direction in which the metal wire 3 extends.

In the embodiment 3, the number of the first gates 12 is two, and the number of the second gates 13 is also two. However, the number of the first gates 12 and the second gates 13 is not limited thereto. It is sufficient that one or more first gates 12 and second gates 13 are provided.

According to the method of manufacturing the semiconductor device described above, the direction of deformation of the metal wire 3 in the filling process is unified with a direction from the side to which the first gate 12 is provided toward the side to which the second gate 13 is provided. Thus, the metal wire 3 is easily corrected in the flow-back process.

Embodiment 4

Figure 13:
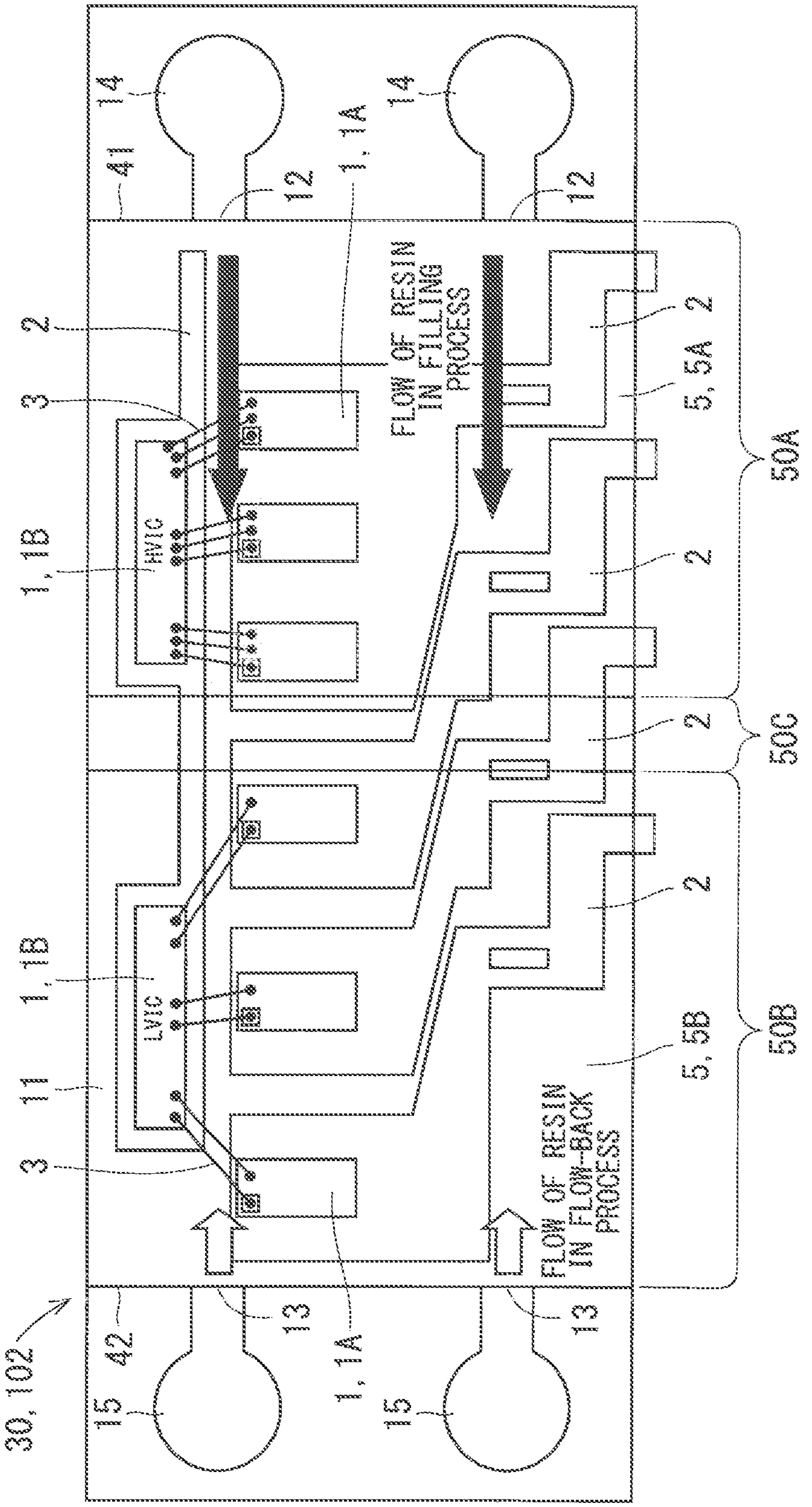
FIG. 13 is a diagram illustrating a process of manufacturing a semiconductor device according to an embodiment 4.

FIG. 13 is a diagram illustrating a process of manufacturing a semiconductor device 102 according to an embodiment 4. The semiconductor device 102 includes the semiconductor chip 1, the lead frame 2, the plurality of metal wires 3, and a sealing material 5.

Configurations of the semiconductor chip 1, the lead frame 2, and the plurality of metal wires 3 are the same as those according to the embodiment 1.

The sealing material 5 according to the embodiment 4 includes first resin 5A as a first sealing material and second resin 5B as a second sealing material. The sealing material 5 includes a first region 50A and a second region 50B. The first region 50A includes the first resin 5A more than the second resin 5B. The second region 50B includes the second resin 5B more than the first resin 5A. A third region 50C in which the first resin 5A and the second resin 5B are mixed with substantially the same concentration may be formed between the first region 50A and the second region 50B.

The second resin 5B has characteristics different from the first resin 5A. The second resin 5B is less expensive than the first resin 5A but is inferior in a thermal conductivity and long-term reliability. The semiconductor device 102 is applied to a power semiconductor module, and includes a region for which a high thermal conductivity is required and a region for which a high thermal conductivity is not required. The region for which the high thermal conductivity is not required is sealed with the second resin 5B.

Figure 14:
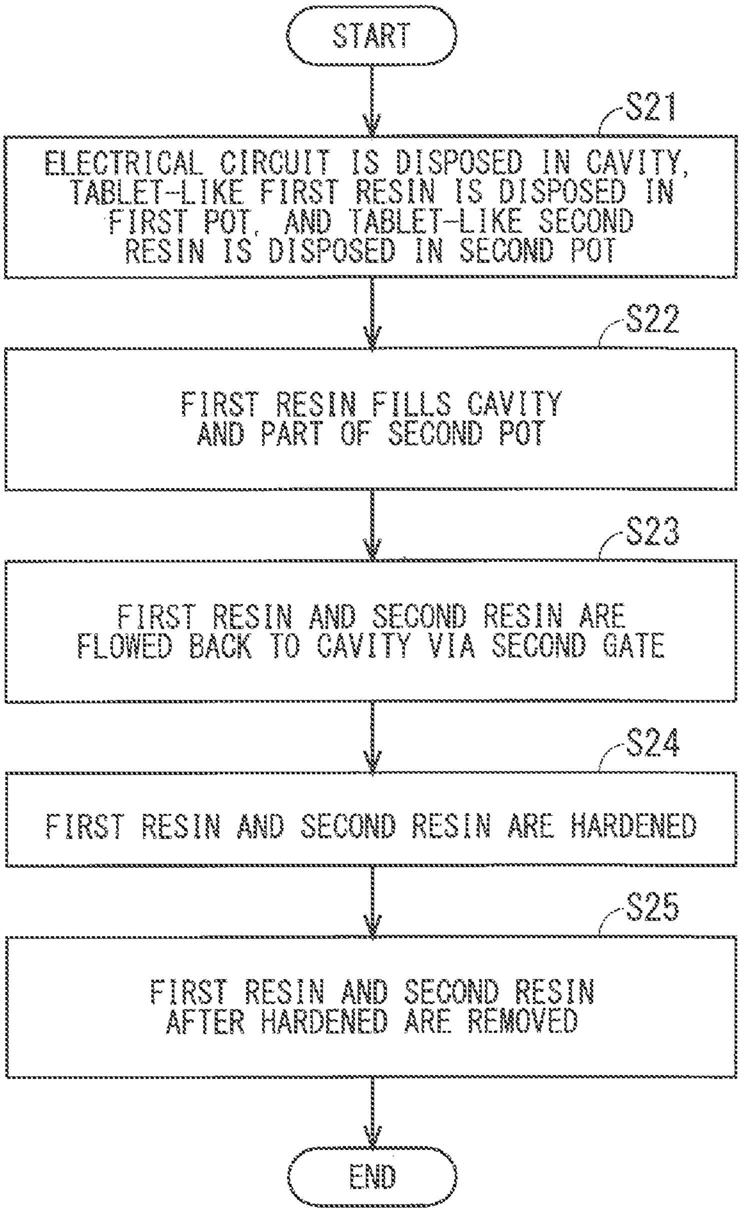
FIG. 14 is a flow chart illustrating a method of manufacturing the semiconductor device according to the embodiment 4.

FIG. 14 is a flow chart illustrating a method of manufacturing the semiconductor device 102 according to the embodiment 4.

In Step S21, an electrical circuit is disposed in the cavity 11 of the mold 30. The electrical circuit has a configuration that the IGBT chip 1A, the IC chip 1B, the lead frame 2, and the metal wire 3 are electrically connected to each other. In this Step S21, the first resin 5A having a tablet-like shape is disposed in the first pot 14 of the mold 30. In the similar manner, the second resin 5B having a tablet-like shape is disposed in the second pot 15, that is to say, the sealing material storage part of the mold 30.

When a large amount of the second resin 5B is disposed in the second pot 15, the first resin 5A injected into the second pot 15 from the cavity 11 decreases, thus there is a possibility that the second resin 5B interferes a purpose of filling the first resin 5A in a gap between the lead frame 2 and the mold. Thus, the amount of the second resin 5B disposed in the second pot 15 is preferably as small as possible, and smaller than a volume of the second pot 15. The amount of the second resin 5B is adjusted in consideration of cost.

In Step S22, the first resin 5A in liquid form is injected from the first gate 12 of the mold 10 to fill the cavity 11 and the second pot 15 with the first resin 5A. Herein, the first resin 5A fills at least a part of cavity 11 and at least a part of the second pot 15.

Figure 15:
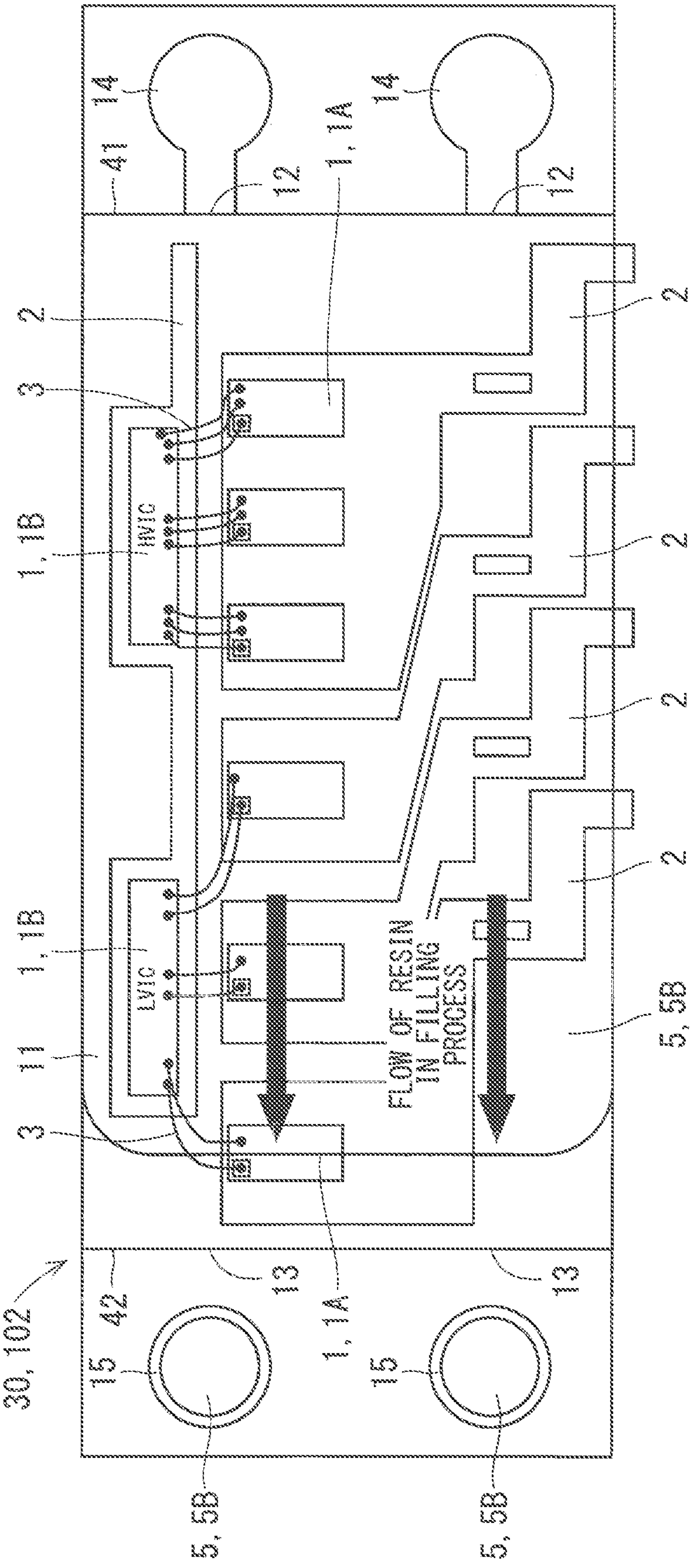
FIG. 15 is a diagram illustrating deformation of the metal wire in a filling process.

The first resin 5A in liquid form fills the gap in the cavity 11 by the filling process of filling with the resin 4A in Step S22. In this filling process, the metal wire 3 is deformed by flow of the first resin 5A. FIG. 15 is a diagram illustrating deformation of the metal wire 3 in the filling process. A distal end of the first resin 5A injected from the first gate 12 is located to cover the metal wire 3 on a leftmost side. The first resin 5A flows from the right side to the left side, thus the metal wire 3 is deformed in accordance with the flow.

The second resin 5B disposed in the second pot 15 in Step S21 and the first resin 5A injected from the first gate 12 to fill the second pot 15 in Step S22 are flowed back to the cavity 11 via the second gate 13 in Step S23.

In this flow-back process in Step S23, the deformation of the metal wire 3 is corrected by the flow of the first resin 5A and the second resin 5B moved from the second gate 13 to the cavity 11 in the manner similar to the embodiment 1. That is to say, two or more curved parts 3A are formed in the elongated shape of the metal wire 3 in a plan view.

The first region 50A rich in the first resin 5A and the second region 50B rich in the second resin 5B are formed by this flow-back process.

In Step S24, the first resin 5A and the second resin 5B are hardened.

In Step S25, the first resin 5A and the second resin 5B which have been hardened and extend from the first gate 12 or the second gate 13 toward the outer side of the cavity 11 are removed.

To summarize the above description, the method of manufacturing the semiconductor device according to the embodiment 4 is the method of manufacturing the semiconductor device 102 in which the electrical circuit including the semiconductor chip 1 and the plurality of metal wires 3 electrically connected to the semiconductor chip 1 is sealed with the plurality of sealing materials 5. The method of manufacturing the semiconductor device 102 includes the process of filling the cavity 11 and at least a part of the sealing material storage part (the second pot 15) with the first sealing material (the first resin 5A) by injecting the first sealing material from the first gate 12 of the mold 30, the mold 30 including the cavity 11 in which the electrical circuit is disposed, the first gate 12 and the second gate 13 provided to the cavity 11, and the sealing material storage part provided to the outer side of the cavity 11 to be connected to the second gate 13. The manufacturing method includes the process of making the second sealing material (second resin 5B) previously filling the sealing material storage part and having characteristics different from the first sealing material and the first sealing material injected from the first gate 12 to fill the sealing material storage part flow back to the cavity 11 via the second gate 13.

According to the method of manufacturing the semiconductor device 102 having the above configuration, a usage amount of the first resin 5A is suppressed, and the inexpensive second resin 5B is used. Thus, manufacturing cost is reduced. The mold 10 described in the embodiment 1 or the mold 20 described in the embodiment 2 may be used for the method of manufacturing the semiconductor device 102 according to this embodiment 4. In that case, the effect similar to that of each embodiment is achieved.

In the present disclosure, each embodiment can be arbitrarily combined, or each embodiment can be appropriately varied or omitted.

The aspects of the present disclosure are collectively described hereinafter as appendixes.

APPENDIX 1

A method of manufacturing a semiconductor device in which an electrical circuit including a semiconductor chip and a plurality of metal wires electrically connected to the semiconductor chip is sealed with a sealing material, comprising steps of:

filling a cavity and at least a part of a sealing material storage part with the sealing material by injecting the sealing material from a first gate of a mold, the mold including the cavity in which the electrical circuit is disposed, the first gate and a second gate provided to the cavity, and the sealing material storage part provided to an outer side of the cavity to be connected to the second gate; and making the sealing material filling the sealing material storage part flow back to the cavity via the second gate.

APPENDIX 2

The method of manufacturing the semiconductor device according to Appendix 1, further comprising steps of:

hardening the sealing material after the sealing material flows back to the cavity via the second gate; and removing the sealing material which has been hardened and extends from the first gate or the second gate toward the outer side of the cavity, wherein the step of making the sealing material flow back into the cavity from the second gate includes a step of applying higher pressure to a second plunger for injecting the sealing material to the cavity from the second gate than pressure applied to a first plunger for injecting the sealing material to the cavity from the first gate, and the sealing material is resin.

APPENDIX 3

The method of manufacturing the semiconductor device according to Appendix 1 or 2, wherein the second gate is disposed near a metal wire extending in a direction having a largest angle in a plurality of angles between a direction in which the sealing material is injected into the cavity from the first gate and a direction in which each of the plurality of metal wires extends in a plan view.

APPENDIX 4

The method of manufacturing the semiconductor device according to any one of Appendixes 1 to 3, wherein the sealing material is injected from a direction perpendicular to the direction in which each of the plurality of metal wires extends.

APPENDIX 5

The method of manufacturing the semiconductor device according to any one of Appendixes 1 to 4, wherein the step of making the sealing material flow back into the cavity via the second gate includes a step of forming two or more curved parts in an elongate shape in a plan view of at least one metal wire in the plurality of metal wires.

APPENDIX 6

A method of manufacturing a semiconductor device in which an electrical circuit including a semiconductor chip and a plurality of metal wires electrically connected to the semiconductor chip is sealed with a plurality of sealing materials, comprising steps of:

filling a cavity and a part of a sealing material storage part with a first sealing material by injecting the first sealing material from a first gate of a mold, the mold including the cavity in which the electrical circuit is disposed, the first gate and a second gate provided to the cavity, and the sealing material storage part provided to an outer side of the cavity to be connected to the second gate; and making the second sealing material filling the sealing material storage part and having characteristics different from the first sealing material and the first sealing material injected from the first gate to fill the sealing material storage part flow back to the cavity via the second gate.

APPENDIX 7

The method of manufacturing the semiconductor device according to Appendix 6, wherein the step of making the second sealing material and the first sealing material flow back to the cavity via the second gate includes a step of forming two or more curved parts in an elongate shape in a plan view of at least one metal wire in the plurality of metal wires.

APPENDIX 8

A semiconductor device, comprising:

an electrical circuit including a semiconductor chip and a plurality of metal wires electrically connected to the semiconductor chip; and a sealing material sealing the electrical circuit, wherein at least one metal wire in the plurality of metal wires includes two or more curved parts in an elongated shape in a plan view.

APPENDIX 9

The semiconductor device according to Appendix 8, wherein the sealing material has a rectangular shape in a plan view, and includes a plurality of sealing material cutting marks provided to a first side and a second side facing the first side of the rectangular shape.

APPENDIX 10

The semiconductor device according to Appendix 8 or 9, wherein the sealing material includes:

a first sealing material;

a second sealing material having characteristics different from the first sealing material;

a first region including the first sealing material more than the second sealing material; and a second region including the second sealing material more than the first sealing material.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device in which an electrical circuit including a semiconductor chip and a plurality of metal wires electrically connected to the semiconductor chip is sealed with a sealing material, comprising steps of:

filling a cavity and at least a part of a sealing material storage part with the sealing material by injecting the sealing material from a first gate of a mold, the mold including the cavity in which the electrical circuit is disposed, the first gate and a second gate provided to the cavity, and the sealing material storage part provided to an outer side of the cavity to be connected to the second gate;

making the sealing material filling the sealing material storage part flow back to the cavity via the second gate;

hardening the sealing material after the sealing material flows back to the cavity via the second gate; and removing the sealing material which has been hardened and extends from the first gate or the second gate toward the outer side of the cavity, wherein the step of making the sealing material flow back into the cavity from the second gate includes a step of applying higher pressure to a second plunger for injecting the sealing material to the cavity from the second gate than pressure applied to a first plunger for injecting the sealing material to the cavity from the first gate such that the step of making the sealing material flow back into the cavity via the second gate causes a step of forming two or more curved parts in an elongate shape in a plan view of at least one metal wire in the plurality of metal wires, and the sealing material is resin.

2. The method of manufacturing the semiconductor device according to claim 1, wherein the second gate is disposed near a metal wire extending in a direction having a largest angle in a plurality of angles between a direction in which the sealing material is injected into the cavity from the first gate and a direction in which each of the plurality of metal wires extends in the plan view.

3. The method of manufacturing the semiconductor device according to claim 1, wherein the sealing material is injected from a direction substantially perpendicular to the direction in which each of the plurality of metal wires extends.

4. The method of manufacturing the semiconductor device according to claim 1, wherein the second gate is disposed nearest to a metal wire extending in a direction having a largest angle in a plurality of angles between a direction in which the sealing material is injected into the cavity from the first gate and a direction in which each of the plurality of metal wires extends in the plan view.

* * * * *